(12) United States Patent
Kojima (10) Patent No.: US 7,423,904 B2
(45) Date of Patent: Sep. 9, 2008

(54) NON-VOLATILE SEMICONDUCTOR MEMORY DEVICE AND OPERATING METHOD THEREOF

(75) Inventor: Masatsugu Kojima, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 125 days.

(21) Appl. No.: 11/538,689

(22) Filed: Oct. 4, 2006

(65) Prior Publication Data

US 2007/0109857 A1 May 17, 2007

(30) Foreign Application Priority Data

Oct. 5, 2005 (JP) ............................. 2005-292904

(51) Int. Cl.
*G11C 16/06* (2006.01)
(52) U.S. Cl. ............................. 365/185.09; 365/185.01; 365/200; 365/201; 714/25; 714/48
(58) Field of Classification Search ............ 365/185.09, 365/185.01, 200, 201; 714/25, 48
See application file for complete search history.

(56) References Cited

U.S. PATENT DOCUMENTS

| | | | | |
|---|---|---|---|---|
| 4,348,742 A | * | 9/1982 | O'Brien ......................... 714/48 |
| 6,003,151 A | * | 12/1999 | Chuang ........................ 714/752 |
| 6,185,134 B1 | | 2/2001 | Tanaka |
| 6,507,518 B2 | | 1/2003 | Hosono et al. |
| 6,549,459 B2 | * | 4/2003 | Higuchi .................. 365/185.09 |
| 6,917,542 B2 | * | 7/2005 | Chen et al. .............. 365/185.22 |
| 6,957,371 B2 | * | 10/2005 | Ricchetti et al. ............. 714/733 |
| 2003/0112669 A1 | * | 6/2003 | Fukushima et al. ......... 365/200 |
| 2006/0098489 A1 | | 5/2006 | Inoue et al. |
| 2006/0117214 A1 | | 6/2006 | Sugiura et al. |

FOREIGN PATENT DOCUMENTS

| | | |
|---|---|---|
| JP | 2002-140899 | 5/2002 |
| JP | 2004-95145 | 3/2004 |
| JP | 2006-79695 | 3/2006 |
| JP | 2006-134476 | 5/2006 |

OTHER PUBLICATIONS

U.S. Appl. No. 11/538,689, filed Oct. 4, 2006, Kojima.

* cited by examiner

*Primary Examiner*—Richard T. Elms
*Assistant Examiner*—Eric Wendler
(74) *Attorney, Agent, or Firm*—Oblon, Spivak, McClelland, Maier & Neustadt, P.C.

(57) ABSTRACT

A non-volatile semiconductor memory device includes a memory cell array having a plurality of electrically-programmable non-volatile memory cells; a byte scan section detecting errors of said non-volatile memory cells per byte and outputting a status of pseudo-pass even though a number of byte errors are equal to or less than a predetermined allowable number of bytes; and a bit scan section detecting bit errors of said non-volatile memory cells per bit at the time of said status of said pseudo-pass being outputted by said byte scan part, and outputting a status of pseudo-pass even though said number of said bit errors are equal to or less than a predetermined allowable number of bits.

21 Claims, 8 Drawing Sheets

NON-VOLATILE SEMICONDUCTOR MEMORY DEVICE AND OPERATING METHOD THEREOF

CROSS-REFERENCE TO RELATED APPLICATIONS

This application is based upon and claims the benefit of priority from the prior Japanese Patent Applications No. 2005-292904, filed on Oct. 5, 2005, the entire contents of which are incorporated herein by reference.

TECHNICAL FIELD

This invention relates to a non-volatile semiconductor memory device and a non-volatile memory system therewith.

BACKGROUND OF THE INVENTION

In a non-volatile semiconductor memory device, for instance, in the case of a NAND flash memory device, it is effective to detect and correct bit errors by ECC (Error Checking and Correcting) to guarantee sufficient reliability of the non-volatile semiconductor memory device. For instance, in a standard non-volatile memory system for a multi-value NAND flash memory device, an ECC is equipped which allows modification and correction of 4 symbols of bit errors per one page.

As one of the technologies to detect the bit errors, a "bit scan method" has been applied. The "bit scan method" is a method to detect whether all the memory cells are in a predetermined data holding state by performing a short batch processing. For instance, by using the "bit scan method", a non-volatile semiconductor memory device providing a detection circuit is proposed in which the method can detect whether all the memory cells are in the predetermined data holding state by performing batch processing at a short time, and further can detect not only whether the whole result of read-out for verification is passed but also can detect a number of failures (bit errors) with a high speed, (U.S. Pat. No. 6,507,518).

In a non-volatile semiconductor memory device, it is advantageous for cost reduction that reliability is guaranteed and the numbers of failures (bit errors) are allowed to the extent that it is allowed to correct with the aforementioned ECC, even though the whole result of the read-out for verification is not passed. A function which has been developed based on this idea is called a "pseudo-pass function." The "pseudo-pass function" stands for a function, in which "pass status" is output as a status even though bit errors are occurring within an extent that they can be corrected by the aforementioned ECC such as 1 bit, 2 bit, in the result of the read-out for verification. The "pseudo-pass function", for example, is described in the U.S. Pat. No. 6,185,134. According to the pseudo-pass function, if a number of failures (bit errors) are within an extent correctable by the ECC, there is no hindrance in the quality of the non-volatile semiconductor memory device. Further the non-volatile semiconductor memory device may include memory cells whose data programming speed is slower than other memory cells. In a case that a number of memory cells whose data programming speed id slow and are of a number within the extent of being correctable by ECC, data programming of the non-volatile semiconductor memory device may be completed without waiting for completion of data programming of all the memory cells. As a consequence, the programming time of the non-volatile semiconductor memory device may be shortened.

However, in a non-volatile semiconductor memory device having the pseudo-pass function, if the number of bit errors are beyond the number of bits which are acceptable to the pseudo-pass function, there exists a problem that the accumulation time of the bit scan becomes longer because the bit scan is repeated until the number of bit scans approaches a predetermined regulation time.

The present invention assigns to provide a non-volatile semiconductor memory device, by which the accumulation time of the bit scan can be reduced, and a non-volatile memory system therewith.

SUMMARY OF THE INVENTION

A non-volatile semiconductor memory device according to one embodiment of the present invention comprises:

a memory cell array having a plurality of electrically-programmable non-volatile memory cells;

a byte scan section detecting errors of said non-volatile memory cells per byte and outputting a status of pseudo-pass even though a number of byte errors are equal to or less than a predetermined allowable number of bytes; and, a bit scan section detecting bit errors of said non-volatile memory cells per bit at the time of said status of said pseudo-pass being outputted by said byte scan part, and outputting a status of pseudo-pass even though said a number of said bit errors are equal to or less than a predetermined allowable number of bits.

A non-volatile semiconductor memory device according to one embodiment of the present invention comprises:

a memory cell array having a plurality of electrically-programmable non-volatile memory cells;

a byte scan section detecting errors of said non-volatile memory cells per byte and outputting a status of pseudo-pass even though a number of byte errors are equal to or less than a predetermined allowable number of bytes in a stage of data programming or data erasing into/from said non-volatile memory cells; and, a bit scan section detecting bit errors of said non-volatile memory cells per bit at the time of said status of said pseudo-pass being outputted by said byte scan part, and outputting a status of pseudo-pass even though said number of said bit errors are equal to or less than a predetermined allowable number of bits in the stage of data programming or data erasing into/from said non-volatile memory cells.

A method for operating a non-volatile semiconductor memory device having a memory cell array having a plurality of electrically programmable non-volatile memory cells according to one embodiment of the present invention comprises:

programming or erasing data into/from said plurality of non-volatile memory cells, verifying said data of said plurality of non-volatile memory cells, 1) completing programming or erasing the data in case that said data are desired data, 2) detecting byte errors of said non-volatile memory cells per byte if said data are not desired data,    2a) programming or erasing said data into/from the plurality of non-volatile memory cells, if byte errors are equal to or more than a predetermined allowable byte number,    2b) outputting a status of pseudo-pass if said byte errors are less than the predetermined allowable byte number,       2b1) detecting bit errors of said non-volatile memory cells, and 2b1a) programming or erasing said data into/from the plurality of non-volatile memory cells, if bit errors are equal to or more than a predetermined allowable bit number, 2b1b) outputting a status of pseudo-pass if said bit errors are less than the predetermined allowable bit number,

DETAILED DESCRIPTION OF THE INVENTION

In one embodiment of the present invention, "byte scan system" stands for a system for detecting errors per byte (8 bits) of the memory cells. The performing time of the byte scan is shorter than that of the system for detecting errors per bit of the memory cells, which is called "bit scan system". To be concrete, while performing time of the bit scan is, for instance, within an extent of 10 μs to 13 μs, performing time of the byte scan is within an extent of 1 μs to 2 μs.

Embodiments of the present invention will be explained. However, the present invention is not limited to the following embodiments.

Embodiment 1

Figure 1:
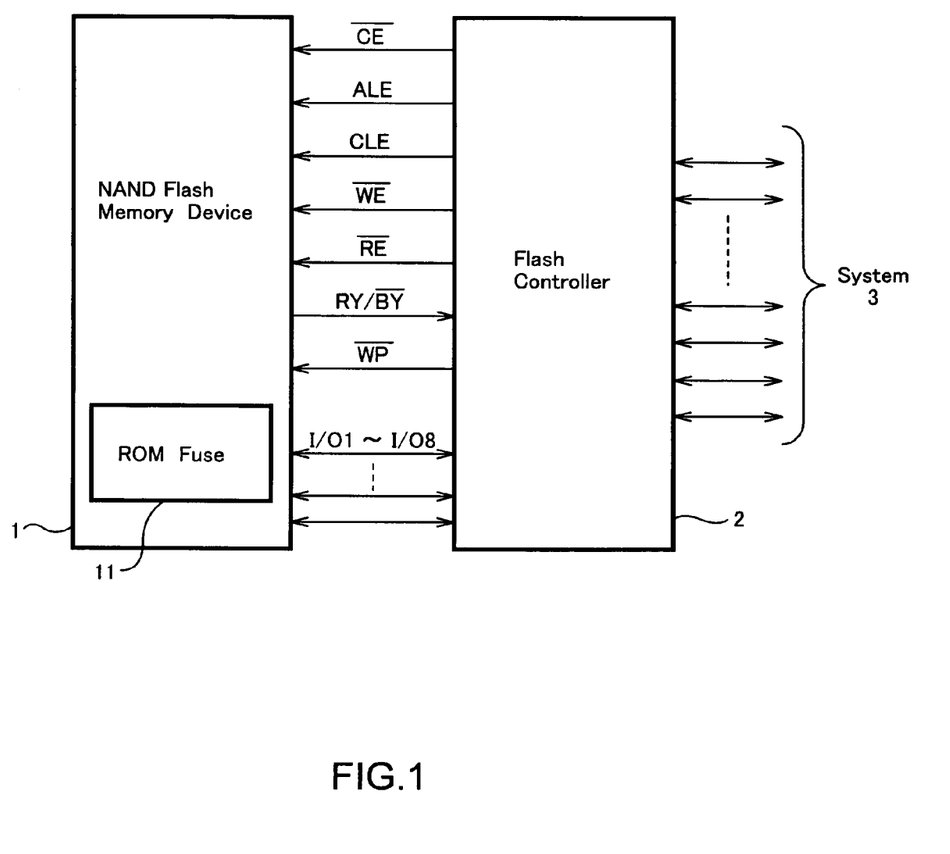
FIG. 1 is a block diagram showing an example of a non-volatile memory system according to one embodiment of the present invention.

An example of the non-volatile memory system of the present invention according to this embodiment using the non-volatile semiconductor memory device is shown in FIG. 1. As shown in FIG. 1, the non-volatile memory system of the present invention according to this embodiment has NAND flash memory device 1 which is a non-volatile semiconductor memory device, and flash controller 2 which is a memory controller.

The flash controller 2 controls the NAND flash memory device. The flash controller 2 accesses the NAND flash memory device 1 in accordance with a request from system 3, for instance, an external host, and controls data read-out, data programming, and data erasing.

The NAND type flash memory device 1 has control pins and input and output pins. The control pins are basically pins for receiving control signals from the flash controller 2. The input and output pins are basically pins for performing sending and receiving data with the flash controller 2, receiving commands from the flash controller 2, and sending a status toward the flash controller 2. In this embodiment, the NAND flash memory device 1 according to this embodiment has /CE (Chip Enable), ALE (Address Latch Enable), CLE (Command Latch Enable), /WE (Write Enable), /RE (Read Enable), RY/BY (Ready/Busy), and /WP (Write Protect), and has I/01 to I/08 as the input and output pins. These control pins and input and output pins are connected to the flash controller 2. Also, the NAND type flash memory device 1 has ROM fuse 11. In addition, the NAND type flash memory device 1 shown in FIG. 1 typically illustrates a schematic view. Further details will be explained later.

Figure 2:
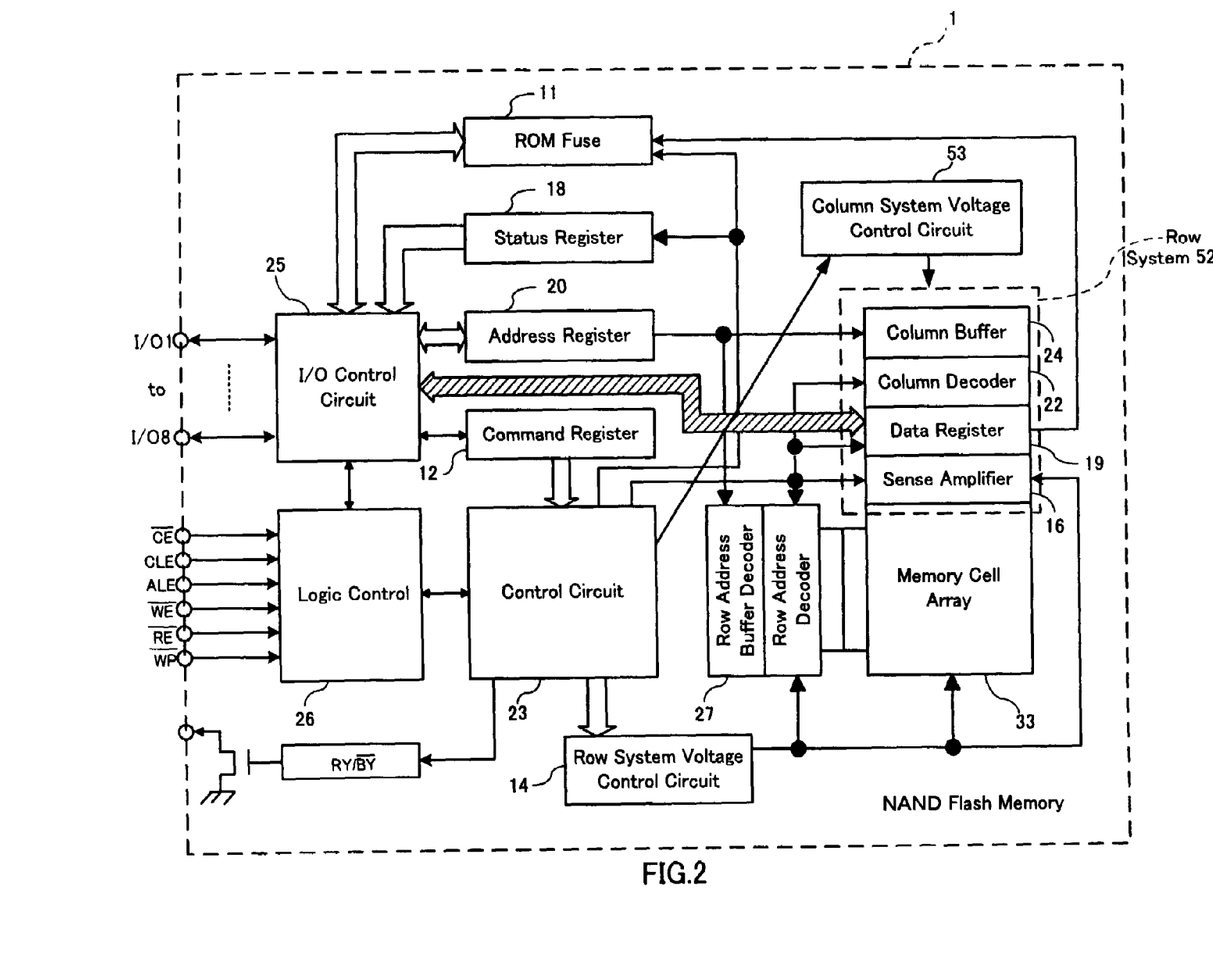
FIG. 2 is a block diagram showing a configuration of the non-volatile semiconductor memory device according to one embodiment of the present invention.

FIG. 2 shows an exemplary configuration of the NAND flash memory device 1 according to this embodiment. As shown in FIG. 2, the NAND flash memory device according to this embodiment has, in addition to the aforementioned control pins, input output pins, and ROM fuse 11, logic control 26, I/O control circuit 25, status register 18, address register 20, command register 12, control circuit 23, row system voltage control circuit 14, row decoder (row address buffer decoder and row address decoder) 27, column buffer 24, column decoder 22, data register 19, sense amplifier 16, memory cell array 33 and column system voltage control circuit 53. In this embodiment, the column buffer 24, the column decoder 22, the data register 19, the sense amplifier 16 are collectively called "row system 52". In this embodiment, the row decoder (row address buffer decoder and row address decoder) 27 is called "row system". Further details of a circuit block of the NAND flash memory device 1 according to this embodiment shown in FIG. 2 will be explained later in detail, with an explanation of its operation.

Figure 3:
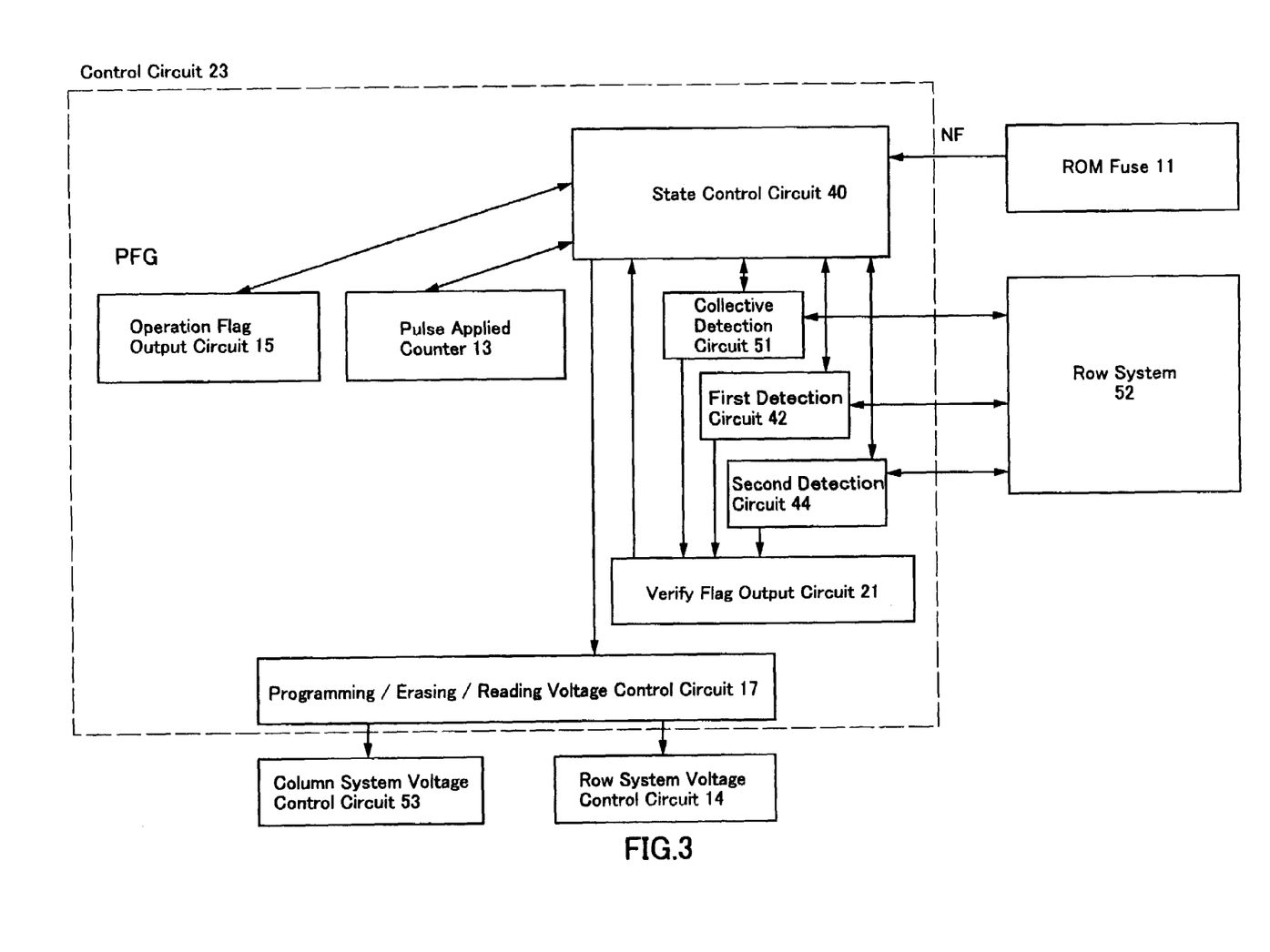
FIG. 3 is a block diagram of a control circuit in the non-volatile semiconductor memory device according to one embodiment of the present invention.

Next, referring to FIG. 3, an operation of pseudo-pass function in the NAND flash memory device 1 according to this embodiment will be explained. As previously described, the NAND flash memory device 1 according to this embodiment shown in FIG. 2 includes the ROM fuse 11 and the control circuit 23. The control circuit 23 has programming/erasing pulse generating circuit 21, pulse applied counter 13, operation flag output circuit 15, programming/erasing/reading voltage control circuit 17, verify flag output circuit 21, state control circuit 40, first detection circuit 42, second detection circuit and collective detection circuit 51 as shown in FIG. 3. The state control circuit 40 controls the pulse applied counter 13, the operation flag output circuit 15, the programming/erasing/reading voltage control circuit 17, the verify flag output circuit 21, the state control circuit 40, the first detection circuit 42, the second detection circuit and the collective detection circuit 51. The first detection circuit 42, the second detection circuit and the collective detection circuit 51 are connected to the column system 52 and the verify flag output circuit 21. The first detection circuit 42, the second detection circuit and the collective detection circuit 51 are to be hereinafter described. The Rom fuse is connected to the control circuit 40. The programming/erasing/reading voltage control circuit 17 is connected to the column system voltage control circuit 53 and the row system voltage control circuit.

In the Rom fuse 11, a number of pseudo-pass function operation pulse is programmed. The number of pseudo-pass function operation pulse is output into the operation output circuit 15 as an output NF. In this embodiment, the Rom fuse 11 stores the number of pseudo-pass function operation pulse, but this invention is not limited to this embodiment. The number of pseudo-pass function operation pulse may be addressed by a metal fuse like the ROM fuse. The number of pseudo-pass function operation pulse may addressed by entering parameters from outside of the control circuit 23 or the NAND flash memory devise 1 of this embodiment.

Outputs of programming/erasing command and a verification read-out are input from the command register 12 and the data register 19 shown in FIG. 2 are input into the state control circuit 40. The state control circuit 40 output signals into the programming/erasing/reading voltage control circuit 17 based on the output of read-out for verification. When the programming/erasing/reading-out pulse is input into the programming/erasing/reading voltage control circuit 17, the programming/erasing/voltage control circuit 17 outputs signals which are required of the data programming/erasing/reading-out into the column system voltage control circuit 53 and the row system voltage control circuit 14 shown in FIG. 2. The state control circuit 40 controls the first detection circuit 42, the second detection circuit 44 and the collective detection circuit so that the first detection circuit 42, the second detection circuit 44 and the collective detection circuit perform a detection operation of the memory cells based on the signals from the column system 52.

The pulse applied counter 13 counts applied time of the programming pulses and/or applied time of erasing pulses. The pulse applied counter 13 updates the number of counters each time that the programming pulse or the erasing pulse is applied. The number of counters is output into the operation flag output circuit 15 as an output OFC.

When the number of pulses programmed into the ROM fuse 11 and the counter number of the pulses applied counter 13 are identical, the operation flag output circuit 15 outputs the pseudo-pass function operation flag PFLG. The PFLG is input into the state control circuit 40. The pseudo-pass function operation flag PFLG is input into the programming/erasing control circuit 17. The programming/erasing control circuit 17 outputs the pseudo-pass function signal in accordance with the pseudo-pass function operation flag PFLG. The pseudo-pass function operation signal is input into the data register 19 shown in FIG. 2. Thus, the pseudo-pass function is set in operation in the NAND flash memory device 1 according to this embodiment.

In addition, as for the operation of the pseudo-pass function in the NAND type flash memory device 1 according to this embodiment, further detail is stated in a patent application by this applicant (U.S. Published Patent Application No. 2006-98489) which is incorporated by reference in this application.

Figure 4:
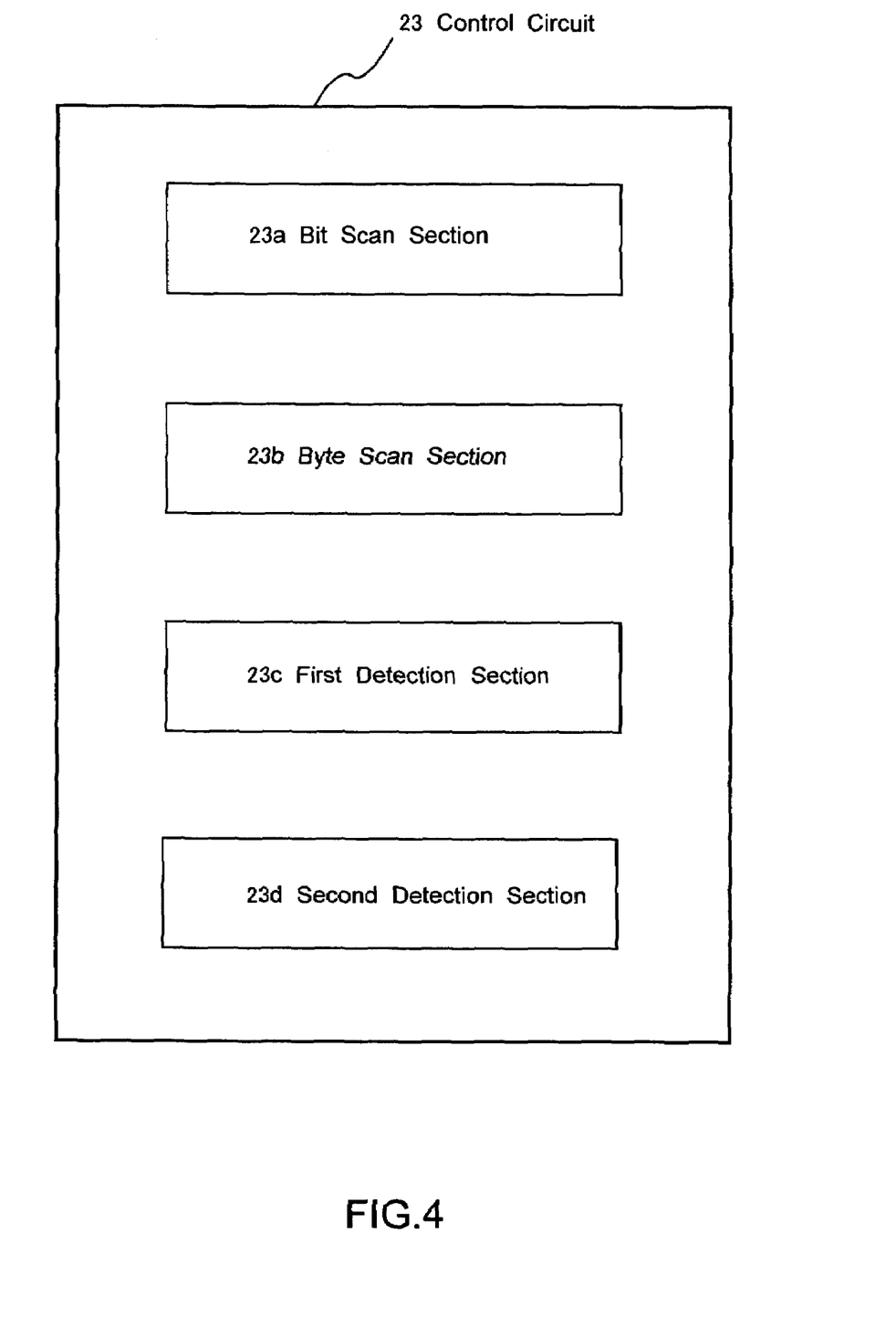
FIG. 4 is a block diagram of a control circuit in the non-volatile semiconductor memory device according to one embodiment of the present invention.

FIG. 4 shows a functional block of the control circuit 23 of the NAND flash memory device 1 according to this embodiment. The control circuit 23 comprises bit scan section 23*a*, byte scan section 23*b*, the first detection section 23*c* and the second detection circuit 23*d*. The byte scan section 23*b* is a circuit which detects errors of the memory cells per byte. The bit scan section 23*a* is a circuit which detects errors of the memory cells per bit. The first detection section 23*c* has a function which may judge whether a number of byte errors being detected by the byte scan section 23*b* is less than the allowable number of bytes. The second detection section 23*b* has a function which may judge whether a number of bit errors being detected by the bit scan section 23*a* is less than the allowable number of bits. The control circuit 23 is not limited to this configuration.

Figure 5:
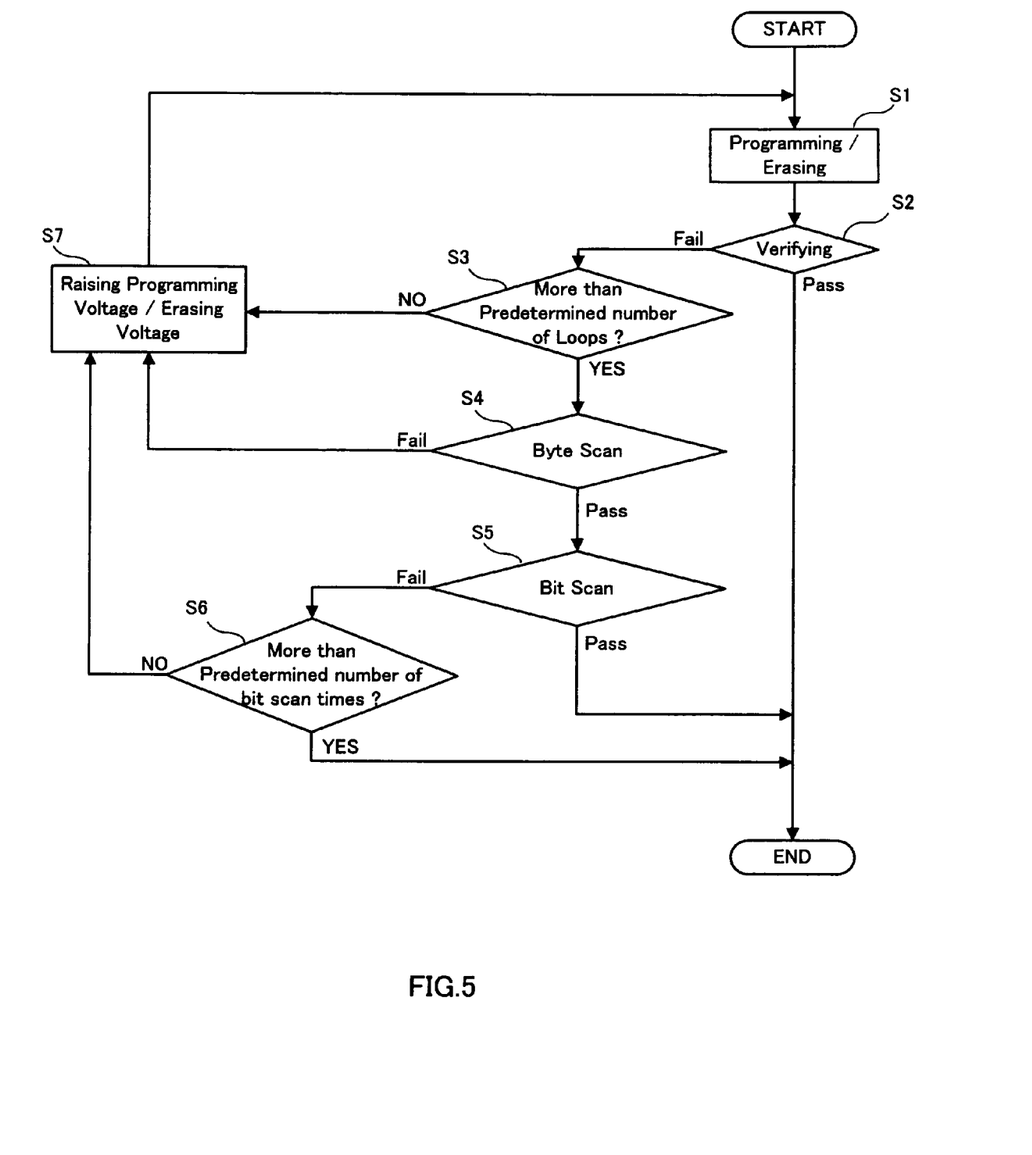
FIG. 5 is a flow chart at the time of data programming or data erasing of the non-volatile semiconductor memory device according to one embodiment of the present invention.

As previously described, data programming or data erasing toward the NAND flash memory device 1 according to this embodiment is performed by the flash controller 2 shown in FIG. 1 which issues a programming command or a erasing command depending on the requirement from system 3. A flow chart at the time of data programming or data erasing of the NAND flash memory device 1 is shown in FIG. 4. As shown in FIG. 5, at first in Step 1 (S1), the control circuit 23 performs the data programming or the data erasing is performed toward a block or a page of the memory cell array 33 shown in FIG. 2. In addition, the "block" stands for a minimum unit of the data programming or the data erasing, as described later. The "page" stands for a configuration unit of the "block".

Next in Step 2 (S2), the control circuit 23 performs read-out for verification of data of the memory cell array. In the read-out for verification of Step 2 (S2), data programming or data erasing is completed if the result is entirely Pass, data programming or data erasing is completed. On the other hand, if the read-out for verification of the Step 2 (S2) is fail ("Fail"), the process is shifted to Step 3 (S3). In Step 3 (S3), it is judged whether the read-out for verification of the data of the memory cell array 33 reaches the predetermined Loop times or not. In addition, the predetermined Loop times of read-out for verification may be optionally set up. The read-out for verification includes verify/read-out operation and detecting operation. The programming/erasing/reading-out voltage control circuit 17 control the voltage for verify/read-out operation in the verify state. The detecting operation is performed by the first detection circuit 42, the second detection circuit and the collective detection circuit 51.

In step 3 (S3) if it is judged by the control circuit 23 that the read-out for verification has reached the predetermined Loop times ("Yes"), the process is shifted to a byte scan of Step 4 (S4). On the other hand, if it is not judged that the read-out for verification of data of the memory cell array 33 has reached the predetermined Loop times by the control circuit 23 ("No"), the process is shifted to Step 7 (S7). In Step 7 (S7), after the control circuit 23 raised the operation voltage for data programming or data erasing, the control circuit 23 returns to Step 1 (S1), and thus data programming or data erasing of the memory cell array 33 is performed again.

In the byte scan of Step 4 (S4), the aforementioned pseudo-pass function is set in operation. In the byte scan of Step 4 (S4) if it is judged that a number of byte errors are equal to or less than the allowable number of bytes by the control circuit 23 ("Pass"), the process is shifted to the bit scan of Step 5 (S5). On the other hand, in the byte scan of Step 4 (S4), if it is judged that the number of byte errors is beyond the allowable number of bytes by the control circuit 23 ("Fail"), the process is shifted to Step 7 (S7). After the control circuit 23 raised the operation voltage for data programming or data erasing, then return to Step 1 (S1) the process returns to Step 1 (S1), data programming or data erasing of the memory cell array 33 is performed again. Details of the byte scan of Step 4 (S4) will be explained later.

Also in the bit scan of Step 5 (S5), the pseudo-pass function is set in operation by the control circuit 23. In the bit scan of Step 5 (S5), if it is judged that the number of bit errors are equal to or less than the permitted bit number ("Pass"), data programming or data erasing is completed. On the other hand, in the bit scan of Step 5 (S5), if it is judged that the number of bit errors is beyond the allowable number of bits ("Fail"), the process is shifted to Step 6 (S6). In Step 6 (S6), it is judged by the control circuit 23 whether the number of the bit scan has reached the regulated number of times or not. In addition, the regulated number of times of the bit scan may be optionally set up. Further details of the bit san of Step 5 (S5) will be explained later.

In Step 6 (S6), if it is determined by the control circuit 23 that the number of bit scan has reached the prescribed number ("Yes"), data programming or erasing will be completed. In this case, the block or the page in which the data programming or the data erasing are performed are registered as "a bad block" or "a bad page". For instance, the later usage of the bad block or the bad page is forbidden. On the other hand, if it is judged by the control circuit 23 that the number of bit scan has not reached the prescribed number ("No"), the process is shifted to Step 7 (S7). After the operation voltage for data programming or data erasing is raised, the process is returned to Step 1 (S1), the data programming or the data erasing is performed again.

Here, the byte scan of aforementioned Step 4 (S4) will be explained with FIG. 6 and FIG. 7.

Figure 6:
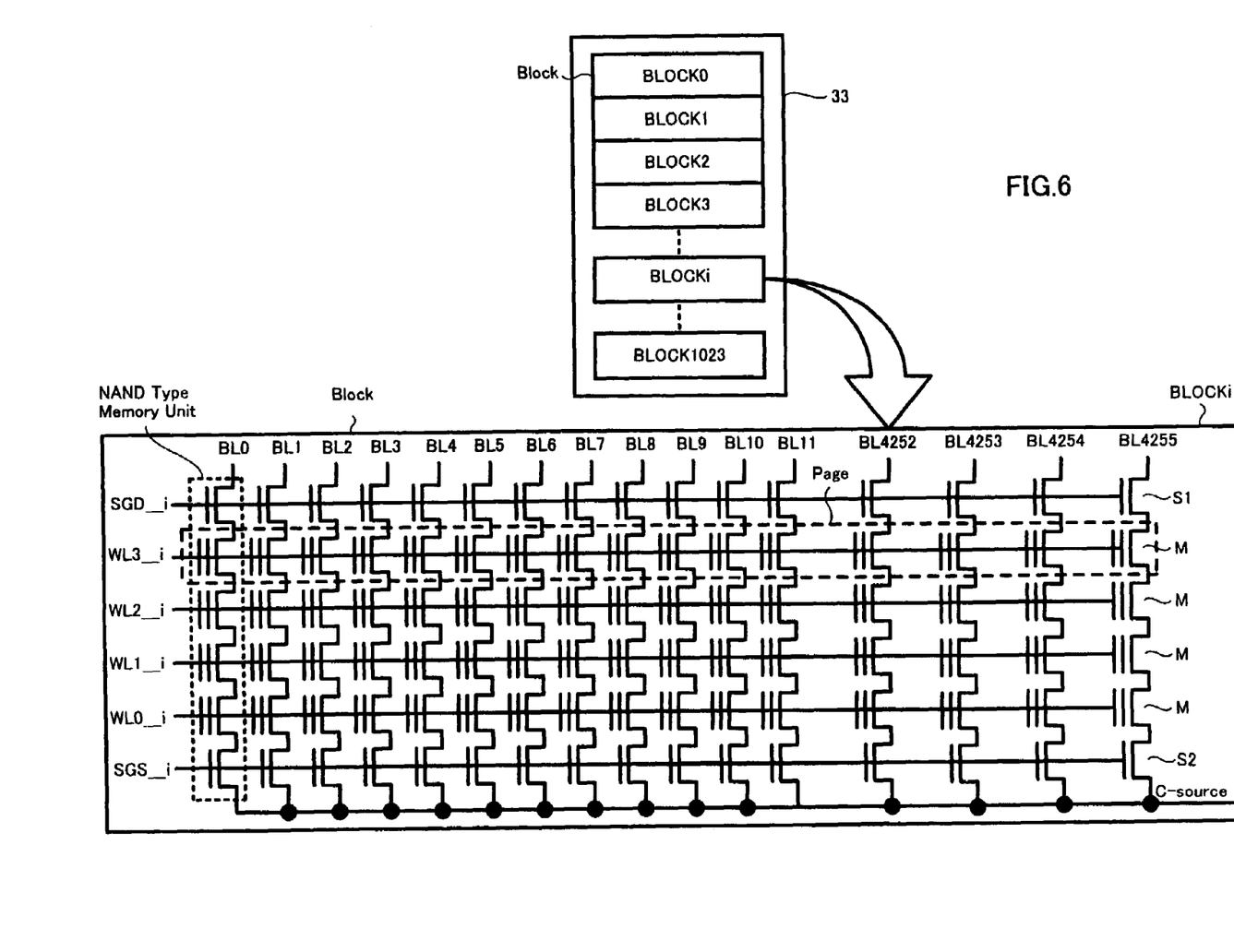
FIG. 6 is a circuit diagram showing one configuration of a memory cell array of the non-volatile semiconductor memory device according to one embodiment of the present invention.

FIG. 6 shows a circuit diagram of one configuration of the memory cell array 33 according to this embodiment shown in FIG. 2. As shown in FIG. 6, the memory cell array 33 according to this embodiment is divided into a plurality of blocks BLOCK 0 to BLOCK 1023 (1024 blocks as a total). Here, a "block" stands for a minimum unit of the data programming or the data erasing. In this embodiment, each of the blocks BLOCK 0 to BLOCK 1023 configures 4256 NAND type memory units, as typically shown in the Block i.

In this embodiment, each of the NAND type memory units is configured so that 4 memory cells M are connected in series. One end is connected to a Bit Line (BL 0 to BL 4255) via the Selection Gate S1 connecting to the Selection Gate Line SGD. The other end is connected to the Common source line C-source via the Selection Gate S2 connecting to the Selection Gate Line SGS. The control gate of each of the memory cell M is connected to the Word Line WL (WL 0_i to WL 3_i). Each memory cell is stored with one bit of data which configures a unit, what called a page that is equal to 4256 memory cells. This means that 532 byte of memory size will be retained with 4256 memory cells per page.

In this embodiment, a number of blocks configuring the memory cell array 33 are set to be 1024. It is further set that one block include 4256 NAND type memory units configuring 4 memory cells. The non-volatile semiconductor memory device and non-volatile memory system of this invention are not limited to this embodiment. The number of blocks, memory cells, and NAND type memory unit of the non-volatile semiconductor memory device and non-volatile memory system of this invention may be changed depending on the desired capacity.

Figure 7:
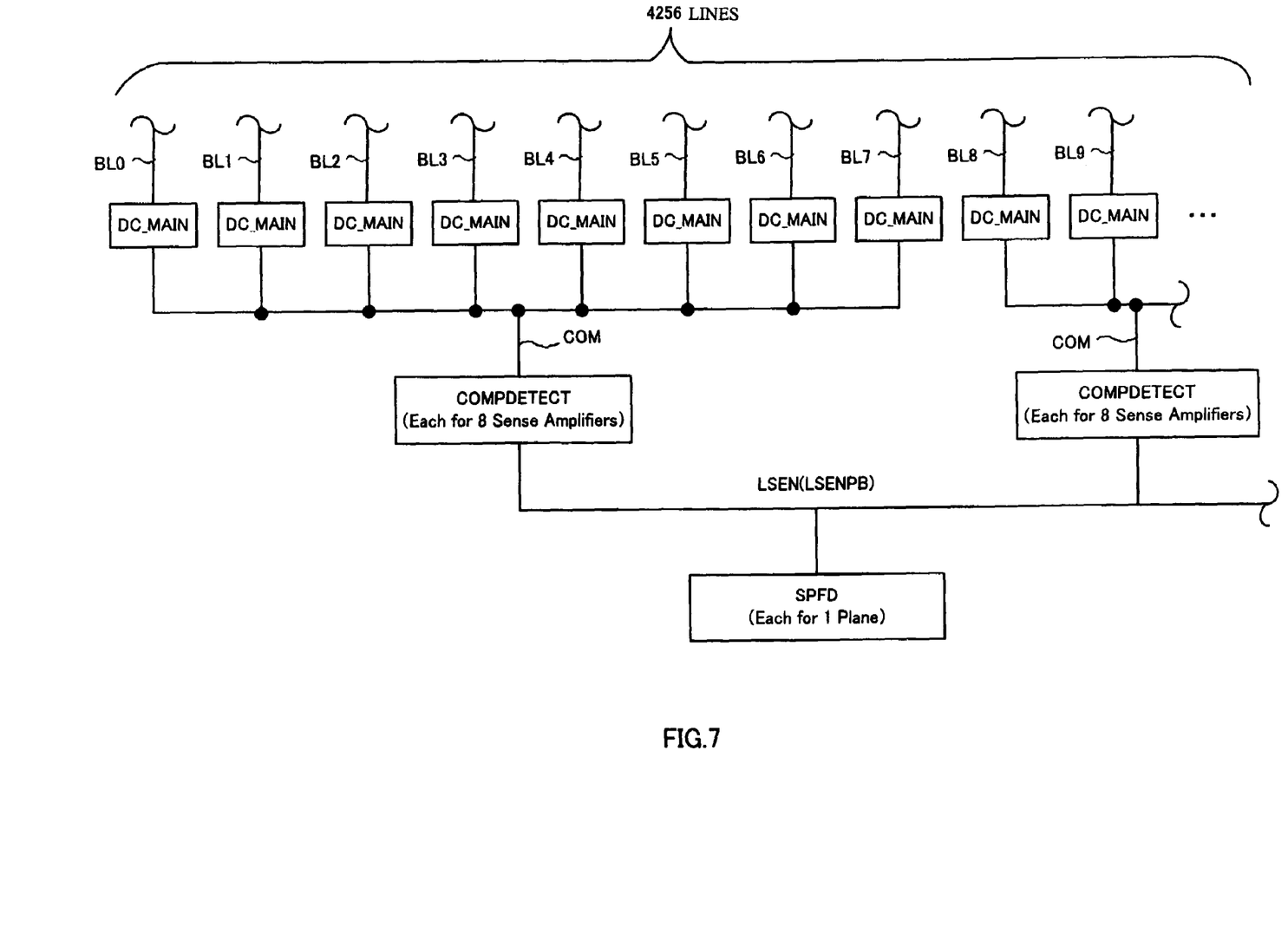
FIG. 7 is a diagram showing one configuration of a system for detecting errors per byte in the non-volatile semiconductor memory device according to one embodiment of the present invention.

FIG. 7 shows one configuration of the system of the NAND type flash memory device 1 according to this embodiment, in which errors are detected per byte. The byte scan system according to this embodiment is included in the control circuit 23. As shown in FIG. 7, each of Bit Lines (BL 0 to BL 4255) connected to the 4256 NAND flash memory device (not shown) of the block BLOCK i shown in FIG. 6 is connected to DC_MAIN, respectively. The DC_MAIN is connected to one node COM per byte (8 bit). The node COM is connected to the COMPDETECT. In addition, each of the COMPDETECT is connected to Common Node LSEN (LSENPB), and the Common Node (LSENPB) is connected to SPFD.

In a byte scan system according to this embodiment, if the data programming or data erasing is performed normally for all of the 8 sense amplifiers connected in each of the nodes COM, the potential of the nodes COM is set as "H" level (Vdd) by the DC_MAIN. On the other hand, if any one of the 8 sense amplifiers connected in each of the nodes COM does not normally perform data programming or data erasing, the potential of the node COM is set as "L" level (Vss) by the DC_MAIN.

Current is allowed to flow into the COMPDETECT, in accordance with the common node LSEN (LSENPB) if the potential of the node COM connected to it is set as "L" level (Vss). Current is allowed to flow into the common node LSEN (LSENPB) which has a size that is in proportion to a number of node COMs whose potential is set to be "L" level (Vss), i.e., the number of errors per byte (8 bits). Hereby a number of byte errors may be detected in the BLOCK i shown in FIG. 6.

Subsequently, the current is flown from the common nodes LSEN (LSENPB) into the SPFD. Here, the current, depending on the allowable number of bytes in the byte scan of Step 4 (S4) is also allowed to flow as shown in FIG. 5 and is also allowed to flow from constant current circuit (not shown) separately in the SPDF. In the SPFD, the amounts of these two currents are compared. If the current which flows from the common nodes LSEN (LSENPB) into the SPFD is larger than the current depending on the allowable number of bytes, the current of the SPFD becomes "L" level ("Vss"), by which the byte scan shown in FIG. 5 is considered to be fail ("Fail"). On the other hand, if the current which flows from the common node LSEN (LSENPB) into the SPFD is less than the current depending on the allowable number of byte, the potential of the SPFD becomes "H" level (Vdd), by which the byte scan shown in FIG. 5 is considered to be a pass ("Pass").

In addition, the allowable number of byte scans of Step 4 (S4) shown in FIG. 5 may be determined, for instance, depending on the allowable number of bits in the bit scan of Step 5 (S5) shown in FIG. 5. That is, for instance in the case that the allowable number of bits in Step 5 (S5) shown in FIG. 5 is 2 bits, the permitted number of bytes in the byte scan of Step 4 shown in FIG. 5 is considered to be 2 bytes. The is because the bit errors which are equal to or more than 3 bits are detected by all means in the bit scan of Step 5 (S5) shown in FIG. 5, and because Step 5 (S5) shown in FIG. 5 always results in fail ("Fail"), if the allowable number of bits in the bit scan of Step 5 (S5) shown in FIG. 5 is 2 bits and the allowable number of bytes in the byte scan of Step 4 (S4) shown in FIG. 5 are set to be equal to or more than 3 bytes. The allowable number of bits in the bit scan of Step 5 (S5) shown in FIG. 5, for instance, may be set optionally depending on, for example, the correctable extent with the aforementioned ECC.

Next, the bit scan of Step 5 (S5) shown in FIG. 5 will be explained. For instance, in a system detecting error per byte of the present invention shown in FIG. 7, the bit scan may be performed by, not a system providing the node COM and the COMPDETECT per byte (8 bit) unit, but a system providing one node COM and one COMPDETECT per bit, i.e., respectively for one DC_MAIN In addition, as for the bit scan, further details are described in U.S. Pat. No. 6,507,518 which is incorporated by reference in this application.

In the non-volatile semiconductor memory device not having a byte scan system as in the conventional non-volatile semiconductor memory device, the probability of a result of the bit scan will be raised ("Fail"), which causes the necessity to repeat the bit scan over and over again. As a consequence, accumulation time of the bit scan becomes longer. In contrast, in the non-volatile semiconductor memory device according to this embodiment, it is possible for the bit scan to be performed as passed ("Pass") with less times because the byte scan may be performed before the bit scan. As a consequence, the accumulation time of the bit scan may be shortened.

The non-volatile semiconductor memory device according to one embodiment of the present embodiment has a system in which the errors of the memory cells are detected per byte (byte scan) and a system in which errors of the memory cells are detected per bit (bit scan). In the non-volatile semiconductor memory device according to this embodiment of the present invention, a status, in which the bit scan of the memory cell may easily be passed, may be detected in advance by performing a byte scan of the memory cell before performing a bit scan of the memory cell. As a consequence, the accumulation time of the bit scan of the memory cell may be reduced.

Embodiment 2

The non-volatile semiconductor memory device and the non-volatile memory system therewith according to this embodiment performs a byte scan of Step 4 (S4) shown in FIG. 5 as a background job when the data programming or the data erasing of Step 1 (S1) shown in FIG. 5 are processing in the non-volatile semiconductor memory device and the non-volatile memory system therewith according to the Embodiment 1. In the non-volatile semiconductor memory device and the non-volatile memory system therewith according to this embodiment, the timing of the data programming or the data erasing of Step 1 (S1) shown in FIG. 5 means the state of the non-volatile semiconductor memory device and the non-volatile memory system therewith according to this embodiment is programming or erasing the data. At the time of data programming or the data erasing of Step 1 (S1) shown in FIG. 5, constant time (for instance, 5 μs) is required in the applied voltage. Here, in the non-volatile semiconductor memory device and the non-volatile memory system therewith according to the Embodiment 1, the leading time of the bit scan is within an extent of 10 to 13 μs, the bit scan may not be performed as a background job of Step 1 (S1). On the other hand, in the non-volatile semiconductor memory device and the non-volatile memory system, the lead time of the byte scan is within an extent of 1 to 2 μs as described above. Therefore, it is possible that the byte scan be performed as the background job of the Step 1 (S1). Thus, at the same time as the data programming or the data erasing of Step 1 (S1) the byte scan is performed as a background job.

Figure 8:
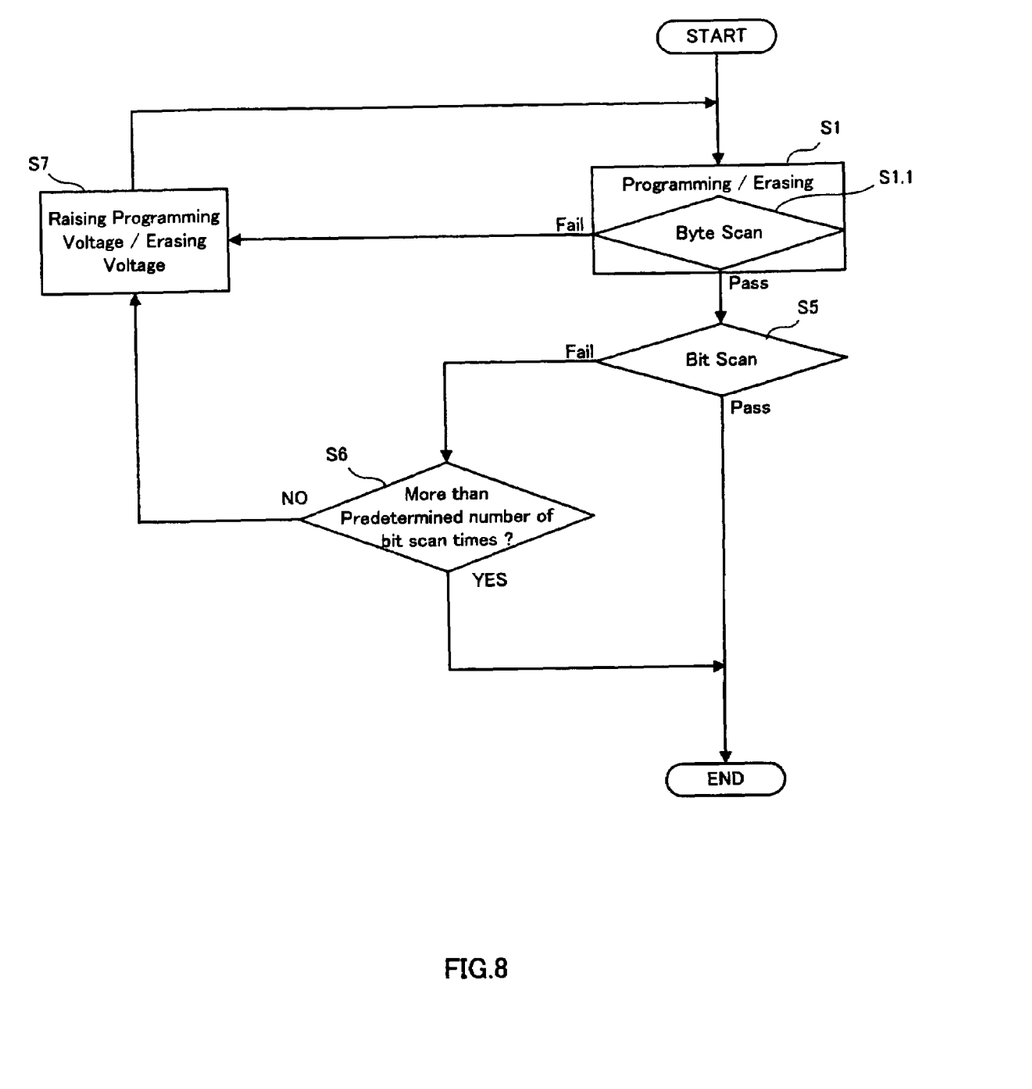
FIG. 8 is a flow chart at the time of data programming or data erasing of the non-volatile semiconductor memory device according to one embodiment of the present invention.

FIG. 8 shows a flow chart at the time of data programming or data erasing of the non-volatile semiconductor memory device and the non-volatile memory system therewith according to this embodiment. As shown in FIG. 8, when the data programming or the data erasing of Step 1 (S1) is performed, the byte scan is performed as a back ground job (Step 1.1 (S1.1.). Hereby, Step 2 (S2) and Step 3 (S3) of the Embodiment 1 shown in FIG. 5 may be abbreviated. The configuration except for this device is the same as the Embodiment 1.

Embodiment 3

In the case of applying a byte scan system to a non-volatile semiconductor memory device and a non-volatile memory system, there is a possibility that "pseudo-pass" may be not detected with a high accuracy. Especially, in a non-volatile semiconductor memory device and a non-volatile memory system which may store multi level data, the allowable number of errors which output "pseudo-pass" may increase at the time of error detection. For example, in a non-volatile semiconductor memory device and a non-volatile memory system which may store four level data, eight level data and sixteen level data, the allowable numbers of errors may correspond to one figure, two figures and three figures, respectively.

A non-volatile semiconductor memory device and a non-volatile memory system according to this embodiment comprise a byte scan system which detects errors of the memory cells per byte and a bit scan system which detects errors of the memory cells per bit. According to the non-volatile semiconductor memory device and the non-volatile memory system of this embodiment, detecting "pseudo-pass" can be performed fast.

The non-volatile semiconductor memory device and the non-volatile memory system of this embodiment can detect errors by using both the byte scan system and the bit scan system. In the non-volatile semiconductor memory device and the non-volatile memory system of this embodiment, the byte scan system may be a current detection type system as described in the embodiment 1. In the non-volatile semiconductor memory device and the non-volatile memory system of this embodiment, a bit scan is performed by reading-out the programmed data from sense amplifiers as in a normal reading-out operation. According to the non-volatile semiconductor memory device and the non-volatile memory system of this embodiment, the detection time of errors may be shortened.

Embodiment 4

The non-volatile semiconductor memory device and the non-volatile memory system according to one embodiment of the present invention may be used in an electronic device, such as a mobile phone terminal and a memory card. The use is not limited.

What is claimed is:

1. A non-volatile semiconductor memory device comprising:
    a memory cell array having a plurality of electrically-programmable non-volatile memory cells;
    a byte scan section detecting errors of said non-volatile memory cells per byte and outputting a status of pseudo-pass even though a number of byte errors are equal to or less than a predetermined allowable number of bytes; and,
    a bit scan section detecting bit errors of said non-volatile memory cells per bit at the time of said status of said pseudo-pass being outputted by said byte scan part, and outputting a status of pseudo-pass even though said number of said bit errors are equal to or less than a predetermined allowable number of bits.

2. The non-volatile semiconductor memory device as claimed in claim 1, further comprising a verification section that verifies data programmed in said non-volatile memory cells.

3. The non-volatile semiconductor memory device as claimed in claim 1,
    wherein said byte scan section has a detection section connected to a predetermined number of sense amplifiers that are connected to said non-volatile semiconductor memory device,
    wherein said detection section detects current outputted from said sense amplifier; and
    wherein said byte errors are detected by comparing said detected current with current corresponding to said allowable number of bytes.

4. The non-volatile semiconductor memory device as claimed in claim 1, wherein said non-volatile memory cells comprise a configuration where an electric charge accumulation layer and a control gate are stacked.

5. The non-volatile semiconductor memory device as claimed in claim 2, further comprising a first judgment section, wherein the number of verifying programmed data is judged after programming or deleting the data into/from said non-volatile memory cells.

6. The non-volatile semiconductor memory device as claimed in claim 5, further comprising a second judgment section, wherein the number of outputting said pseudo-pass by said bit scan part after programming or deleting the data into/from said non-volatile memory cells.

7. The non-volatile semiconductor memory device as claimed in claim 3,
wherein said bit scan section detects said bit errors by inspecting data that are read-out from all of said sense amplifiers connected to said non-volatile memory cells.

8. The non-volatile semiconductor memory device as claimed in claim 4, wherein said non-volatile semiconductor memory device is a NAND type flash memory device.

9. A non-volatile semiconductor memory device comprising:
a memory cell array having a plurality of electrically-programmable non-volatile memory cells;
a byte scan section detecting errors of said non-volatile memory cells per byte and outputting a status of pseudo-pass even though a number of byte errors are equal to or less than a predetermined allowable number of bytes in a stage of data programming or data erasing into/from said non-volatile memory cells; and,
a bit scan section detecting bit errors of said non-volatile memory cells per bit at the time of said status of said pseudo-pass being outputted by said byte scan part, and outputting a status of pseudo-pass even though said number of said bit errors are equal to or less than a predetermined allowable number of bits in the stage of data programming or data erasing into/from said non-volatile memory cells.

10. The non-volatile semiconductor memory device as claimed in claim 9, further comprising a verification section that verifies data programmed in said non-volatile memory cells.

11. The non-volatile semiconductor memory device as claimed in claim 9,
wherein said byte scan section has a detection section connected to a predetermined number of sense amplifiers that are connected to said non-volatile semiconductor memory device,
wherein said detection section detects current outputted from said sense amplifier; and
wherein said byte errors are detected by comparing said detected current with current corresponding to said allowable number of bytes.

12. The non-volatile semiconductor memory device as claimed in claim 9, wherein said non-volatile memory cells comprise a configuration where an electric charge accumulation layer and a control gate are stacked.

13. The non-volatile semiconductor memory device as claimed in claim 10, further comprising a first judgment section, wherein the number of verifying programmed data is judged after programming or deleting the data into/from said non-volatile memory cells.

14. The non-volatile semiconductor memory device as claimed in claim 13, further comprising a second judgment section, wherein the number of outputting said pseudo-pass by said bit scan part after programming or deleting the data into/from said non-volatile memory cells.

15. The non-volatile semiconductor memory device as claimed in claim 11,
wherein said bit scan section detects said bit errors by inspecting data that are read-out from all of said sense amplifiers connected to said non-volatile memory cells.

16. The non-volatile semiconductor memory device as claimed in claim 12, wherein said non-volatile semiconductor memory device is a NAND type flash memory device.

17. A method for operating a non-volatile semiconductor memory device having a memory cell array having a plurality of electrically programmable non-volatile memory cells, comprising:
programming or erasing data into/from said plurality of non-volatile memory cells,
verifying said data of said plurality of non-volatile memory cells,
1) completing programming or erasing the data in case that said data are desired data,
2) detecting byte errors of said non-volatile memory cells per byte if said data are not desired data,
2a) programming or erasing said data into/from the plurality of non-volatile memory cells, if byte errors are equal to or more than a predetermined allowable byte number,
2b) outputting a status of pseudo-pass if said byte errors are less than the predetermined allowable byte number,
2b1) detecting bit errors of said non-volatile memory cells, and
2b1a) programming or erasing said data into/from the plurality of non-volatile memory cells, if bit errors are equal to or more than a predetermined allowable bit number,
2b1b) outputting a status of pseudo-pass if said bit errors are less than the predetermined allowable bit number.

18. The non-volatile semiconductor memory device as claimed in claim 17, further comprising a detection section which detects bit errors of said non-volatile memory cells per bit.

19. The non-volatile semiconductor memory device as claimed in claim 17,
wherein the number of verifying data of said plurality of non-volatile memory cells is judged, and if said verified number is not equal to or more than the predetermined numbers, voltages for programming or erasing are raised, and data of said non-volatile memory cells are programmed or erased again.

20. The non-volatile semiconductor memory device as claimed in claim 17, wherein said non-volatile memory cells comprise a configuration where an electric charge accumulation layer and a control gate are stacked.

21. The non-volatile semiconductor memory device as claimed in claim 20, wherein said non-volatile semiconductor memory device is a NAND type flash memory device.

* * * * *